United States Patent
Im et al.

(10) Patent No.: US 8,723,170 B2
(45) Date of Patent: May 13, 2014

(54) TFT, DISPLAY APPARATUS INCLUDING TFT, AND ORGANIC LIGHT-EMITTING DISPLAY APPARATUS INCLUDING TFT

(71) Applicants: Ki-Ju Im, Yongin (KR); Hui-Won Yang, Yongin (KR); Min-Kyu Kim, Yongin (KR); Jong-Han Jeong, Yongin (KR); Kwang-Suk Kim, Yongin (KR)

(72) Inventors: Ki-Ju Im, Yongin (KR); Hui-Won Yang, Yongin (KR); Min-Kyu Kim, Yongin (KR); Jong-Han Jeong, Yongin (KR); Kwang-Suk Kim, Yongin (KR)

(73) Assignee: Samsung Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 13/688,313

(22) Filed: Nov. 29, 2012

(65) Prior Publication Data
US 2013/0240846 A1      Sep. 19, 2013

(30) Foreign Application Priority Data
Mar. 15, 2012   (KR) .................. 10-2012-0026602

(51) Int. Cl.
*H01L 29/08* (2006.01)
(52) U.S. Cl.
USPC .. 257/40; 257/43; 257/E33.006; 257/E29.117
(58) Field of Classification Search
USPC .................. 257/40, 43, E33.006, E29.117
See application file for complete search history.

(56) References Cited

U.S. PATENT DOCUMENTS

| 6,316,808 | B1 | 11/2001 | Smith, III |
| 6,828,585 | B2* | 12/2004 | Ueda ................................ 257/59 |
| 6,917,392 | B2* | 7/2005 | Hannuki et al. ................. 349/43 |
| 2008/0197350 | A1 | 8/2008 | Park et al. |
| 2010/0244034 | A1 | 9/2010 | Miyairi |
| 2012/0199891 | A1* | 8/2012 | Suzuki et al. .................. 257/288 |
| 2012/0241736 | A1* | 9/2012 | Imoto et al. ..................... 257/43 |

FOREIGN PATENT DOCUMENTS

| KR | 10-2008-0076608 A | 8/2008 |
| KR | 10-2008-0114262 A | 12/2008 |
| KR | 10-2009-0111081 A | 10/2009 |
| KR | 10-2010-0108232 A | 10/2010 |

* cited by examiner

*Primary Examiner* — Trung Q Dang
(74) *Attorney, Agent, or Firm* — Lee & Morse, P.C.

(57) ABSTRACT

A thin film transistor includes a gate electrode having a first length measured in a first direction and a first width measured in a second direction, an active layer having a second length measured in the first direction and a second width measured in the second direction, the second length of the active layer being greater than the first length of the gate electrode, and the second width of the active layer being greater than the first width of the gate electrode, and a source electrode and a drain electrode that are connected to the active layer, wherein at least one of opposite side edges of the gate electrode extending in the first direction is spaced apart from a corresponding opposite side edge of the active layer extending in the first direction.

16 Claims, 5 Drawing Sheets

TFT, DISPLAY APPARATUS INCLUDING TFT, AND ORGANIC LIGHT-EMITTING DISPLAY APPARATUS INCLUDING TFT

CROSS-REFERENCE TO RELATED PATENT APPLICATION

This application claims the benefit of Korean Patent Application No. 10-2012-0026602, filed on Mar. 15, 2012, in the Korean Intellectual Property Office, the disclosure of which is incorporated herein in its entirety by reference.

BACKGROUND

1. Field

Embodiments relate to a thin film transistor (TFT), a display apparatus including the TFT, and an organic light-emitting display apparatus including the TFT.

2. Description of the Related Art

A TFT is used as a switching device or a driving device of a liquid crystal display apparatus or an organic light-emitting display apparatus. The characteristics of a TFT are affected by materials and states of a channel layer.

Since amorphous silicon has low mobility, an oxide semiconductor that has high mobility and is processed at a low temperature has increasingly used as a channel layer of a TFT.

SUMMARY

Embodiments are directed to a thin film transistor including a gate electrode having a first length measured in a first direction and a first width measured in a second direction, an active layer having a second length measured in the first direction, and a second width measured in the second direction, the second length of the active layer being greater than the first length of the gate electrode, and the second width of the active layer being greater than the first width of the gate electrode, and a source electrode and a drain electrode that are connected to the active layer, wherein at least one of opposite side edges of the gate electrode extending in the first direction is spaced apart from a corresponding opposite side edge of the active layer extending in the first direction.

The opposite side edges of the gate electrode extending in the first direction may be spaced apart from the opposite side edges of the active layer extending in the first direction.

The opposite side edges of the gate electrode extending in the first direction may be spaced apart by a same interval from the opposite side edges of the active layer extending in the first direction.

The opposite side edges of the gate electrode extending in the first direction may be disposed within the opposite side edges of the active layer extending in first direction.

One of the opposite side edges of the gate electrode extending in the first direction may be connected in the second direction to a wiring having a width in the first direction that is smaller than the first length of the gate electrode, and the wiring overlaps with a boundary of the active layer extending in the first direction.

The first length of the gate electrode may be greater than the first width of the gate electrode.

The source electrode and the drain electrode may extend in the first direction and face each other.

The active layer may include an oxide semiconductor.

The active layer may include oxygen and at least one selected from gallium, indium, zinc, hafnium, and tin.

The source electrode and the drain electrode may be connected to the active layer through respective contact holes.

The active layer may include a region in which ion impurities are doped. The source electrode and the drain electrode may be connected to the region through the contact holes.

The source electrode and the drain electrode may be connected to the active layer through respective ohmic contact layers.

The gate electrode may be disposed below the active layer.

The gate electrode may be disposed above the active layer.

Embodiments are also directed to a display apparatus including a thin film transistor including a gate electrode having a first length measured in a first direction and a first width measured in a second direction, an active layer having a second length measured in the first direction and a second width measured in the second direction, the second length of the active layer being than the first length of the gate electrode, and the second width of the active layer being greater than the first width, and a source electrode and a drain electrode that are connected to the active layer, wherein at least one of opposite side edges of the gate electrode extending in the first direction is spaced apart from opposite side edges of the active layer extending in the first direction, and a display device driven by the thin film transistor.

Embodiments are also directed to an organic light-emitting display apparatus including a thin film transistor including a gate electrode having a first length measured in a first direction and a first width measured in a second direction, an active layer having a second length measured in the first direction and a second width measured in the second direction, the second length of the active layer being than the first length of the gate electrode, and the second width of the active layer being greater than the first width, and a source electrode and a drain electrode that are connected to the active layer, wherein at least one of opposite side edges of the gate electrode extending in the first direction is spaced apart from opposite side edges of the active layer extending in the first direction, a pixel electrode connected to one of the source electrode and the drain electrode of the thin film transistor, an opposite electrode facing the pixel electrode, and an organic light-emitting layer disposed between the pixel electrode and the opposite electrode.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

As used herein, the term "and/or" includes any and all combinations of one or more of the associated listed items. Expressions such as "at least one of," when preceding a list of elements, modify the entire list of elements and do not modify the individual elements of the list.

Figure 1A:
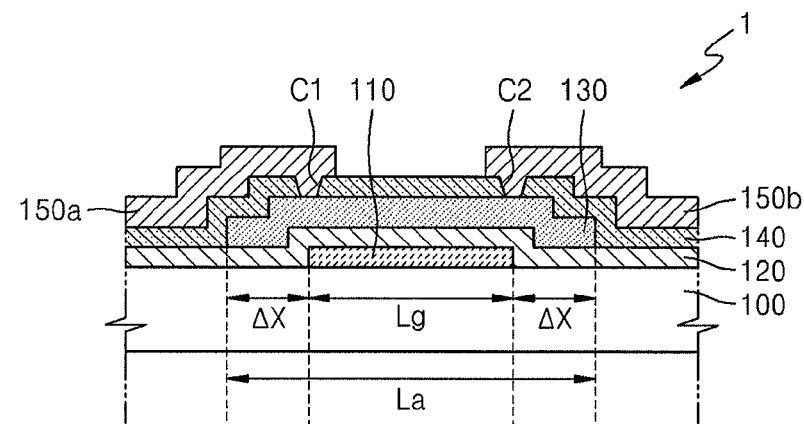
FIG. 1A illustrates a cross-sectional view a TFT according to an embodiment.
Figure 1B:
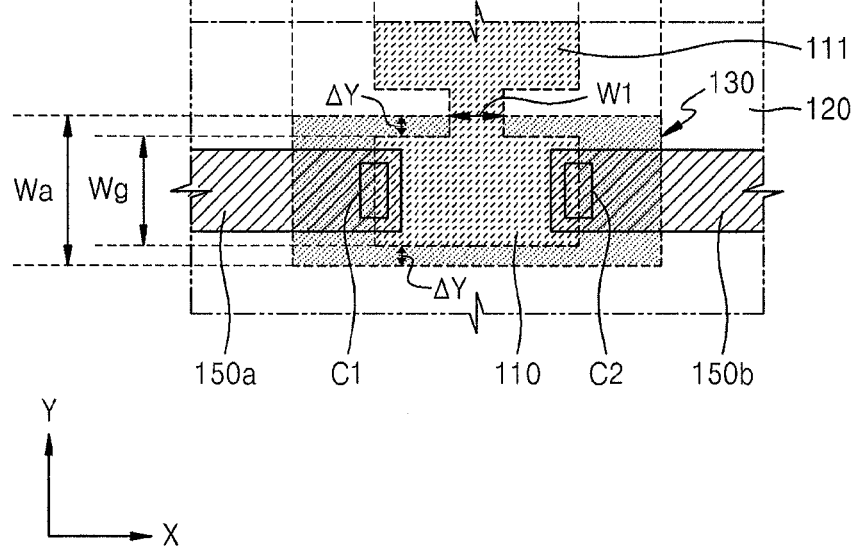
FIG. 1B illustrates a plan view of the TFT according to the embodiment

FIGS. 1A and 1B illustrate a TFT 1 according to an embodiment.

FIG. 1A illustrates a cross-sectional view of the TFT 1 and FIG. 1B is a plan view of the TFT 1.

Referring to FIGS. 1A and 1B, the TFT 1 has a bottom gate structure in which a gate electrode 110, an active layer 130, and a source electrode 150a and a drain electrode 150b are sequentially formed on a substrate 100.

The substrate 100 may be formed of a transparent glass material including $SiO_2$ as a primary component. In other implementations, the substrate 100 may be formed of an opaque material and may be other materials such as a plastic material.

A buffer layer (not shown) including $SiO_2$ and/or $SiN_x$ may be formed on the substrate 100. The buffer layer may smooth the substrate 100 and may prevent impurities from penetrating into the substrate 100.

The gate electrode 110 has a first length Lg measured in a first direction X and a first width Wg measured in a second direction Y. The gate electrode 110 is defined by opposite side edges having the first length Lg measured in the first direction X and opposite side edges having the first width Wg measured in the second direction Y. The first length Lg of the gate electrode 110, which is measured in the first direction X, may be greater than the first width Wg measured in the second direction Y.

One of the opposite side edges of the gate electrode 110, which extend in the first direction X, is connected to a wiring 111 for applying a scanning signal to the gate electrode 110.

According to the present embodiment, the wiring 111 has a width W1 in the first direction that is smaller than the first length Lg of the gate electrode 110. The wiring W1 extends in the second direction Y on the gate electrode 110. In FIG. 1B, the gate electrode 110 and the wiring 111 are shown to be connected to have a 'T' shape, but in other implementations, other shapes are possible.

The gate electrode 110 and the wiring 111 extending on the gate electrode 110 may be formed of at least one conductive material selected from silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and Al/Cu.

A first insulating layer 120 may be disposed on the gate electrode 110 so as to cover the gate electrode 110. The first insulating layer 120 may serve as a gate insulating layer. The first insulating layer 120 may be an inorganic insulating layer formed of at least one selected from $SiO_2$, $SiN_x$, SiON, $Al_2O_3$, $TiO_2$, $Ta_2O_5$, $HfO_2$, and $ZrO_2$.

The active layer 130 including an oxide semiconductor is disposed on the first insulating layer 120. The oxide semiconductor may include at least one selected from gallium (Ga), indium (In), zinc (Zn), hafnium (Hf), and tin (Sn). For example, the active layer 130 may be formed of a material selected from InGaZnO, ZnSnO, InZnO, InGaO, ZnO, TiO, and a hafnium-indium-zinc oxide (HIZO).

According to the present embodiment, the active layer 130 has a second length La measured in the first direction X and a second width Wa measured in the second direction Y. The second length La of the active layer 130, which is measured in the first direction X, may be greater than the second width Wa measured in the second direction Y.

A second insulating layer 140 may be disposed on the active layer 130. The second insulating layer 140 may be an inorganic insulating layer formed of at least one selected from $SiO_2$, $SiN_x$, SiON, $Al_2O_3$, $TiO_2$, $Ta_2O_5$, $HfO_2$, and $ZrO_2$.

The source electrode 150a and the drain electrode 150b may be disposed on the second insulating layer 140 so as to be connected to the active layer 130 through contact holes C1 and C2 formed in the second insulating layer 140, respectively.

The source electrode 150a and the drain electrode 150b may extend in the first direction X. As shown in FIG. 1B, a width of each of the source electrode 150a and the drain electrode 150b, which is measured in the second direction Y, may be smaller than a width of the gate electrode 110, which is measured in the second direction Y.

Regions on which n+ or p+ type ion impurities are doped may be formed on respective edges of the active layer 130. The contact holes C1 and C2 may be connected to regions of the active layer 130 on which ion impurities are doped.

A channel may be formed on a region where the active layer 130, the gate electrode 110, and the wiring 111 connected to the gate electrode 110 overlap with each other. In a general TFT, the first length Lg of the gate electrode 110, which is measured in the first direction X, is smaller than the second length La of the active layer 130, but the first width Wg of the gate electrode 110, which is measured in the second direction Y, is greater than the second width Wa of the active layer 130.

However, in the TFT 1 according to the present embodiment, the first length Lg of the gate electrode 110, which is measured in the first direction X, is smaller than the second length La of the active layer 130, and also the first width Wg of the gate electrode 110, which is measured in the second direction Y, is smaller than the second width Wa of the active layer 130.

In more detail, opposite side edges of the gate electrode 110 extending in the first direction X are spaced apart from opposite side edges of the active layer 130 extending in the first direction X by a distance ΔY so as to be within the opposite side edges of the active layer 130 extending in the first direction X. Opposite side edges of the gate electrode 110 extending in the second direction Y are spaced apart from opposite side edges of the active layer 130 extending in the second direction Y by a distance ΔX so as to be within the opposite side edges of the active layer 130 extending in the second direction Y.

The wiring 111 that is connected to the gate electrode 110 in the second direction Y may partially overlap with one boundary of opposite boundaries of the active layer 130 extending the first direction X. Thus, the wiring 111 and the active layer 130 overlap with a boundary of a channel extending in the first direction X by the width W1 of the wiring 111 in the first direction X.

In this case, the width W1 of a portion of the wiring 111 that is connected to the gate electrode 110 at the boundary of the channel reduces an area that overlaps with the boundary of the channel. Thus, a width of a portion of the wiring 111 that is far way from the boundary of the channel may be greater than the width W1 of the portion of the wiring 111 that overlaps the boundary of the channel. As shown in FIG. 1B, the width of the portion of the wiring 111 that is far way from the boundary of the channel may be the same as the length Lg of the gate electrode 110 as measured in the first direction X. In other implementations, the width of the portion of the wiring 111 that is far way from the boundary of the channel may be different from the length Lg of the gate electrode 110, as measured in the first direction X.

As described above, in the TFT 1 according to the present embodiment, a portion of the boundary of the channel that overlaps with boundaries of the first direction X of the gate electrode 110 and/or the wiring 111, and the active layer 130 is small. Thus, a threshold voltage (Vth) of a TFT is barely changed according to a drain voltage such that stable device characteristics may be obtained.

Figure 2:
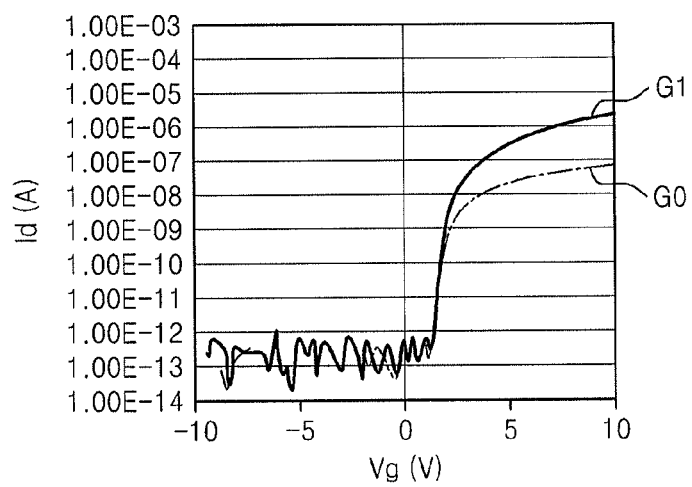
FIG. 2 illustrates a graph of a gate voltage (Vg)-drain current (Id) relationship of the TFT, according to the embodiment of FIGS. 1A and 1B.

FIG. 2 illustrates a graph of a gate voltage (Vg)-drain current (Id) relationship of the TFT 1 according to an embodiment.

The graph of FIG. 2 relates to a TFT in which the first length Lg of the gate electrode 110, which is measured in the first direction X, is 40 μm, the first width Wg measured in the second direction Y is 20 μm, opposite side edges of the gate electrode 110 extending in the first direction X are spaced apart from opposite side edges of the active layer 130 extending in the first direction X by 2 μm (=ΔY), and a width W1 of a portion of the writing 111 that overlaps with a boundary of the channel extending in the first direction X is 4 μm.

In FIG. 2, G0 indicates a gate voltage (Vg)-drain current (Id) relationship of a bias voltage (VD=0.1V), and G1 indicates a Vg-Id relationship when a drain voltage (VD) is 5.1 V.

Referring G0 and G1, with regard to the TFT 1, it is shown that, even if a drain voltage increases, the threshold voltage (Vth) of the TFT 1 is barely changed.

When a drain voltage is increased, if a defect were to be generated at a boundary of a channel, a threshold voltage of a TFT could be changed. According to the present embodiment, however, a TFT may be configured such that portions of the gate electrode 110 and the active layer 130 that overlap with the boundary of the channel are reduced, thereby obtaining a stable device whose threshold voltage is barely changed when the drain voltage is increased.

Such a defect that affects the threshold voltage of a TFT is more frequently generated in a device having a channel having a length is greater than its width. In a TFT in which the first length Lg of the gate electrode 110 extending in the first direction X is greater than the second width Wg extending in the second direction Y, a structure for minimizing a portion of the gate electrode 110 that overlaps with the boundary of the channel may be used, thereby minimizing a change in a threshold voltage of the TFT.

Figure 3:
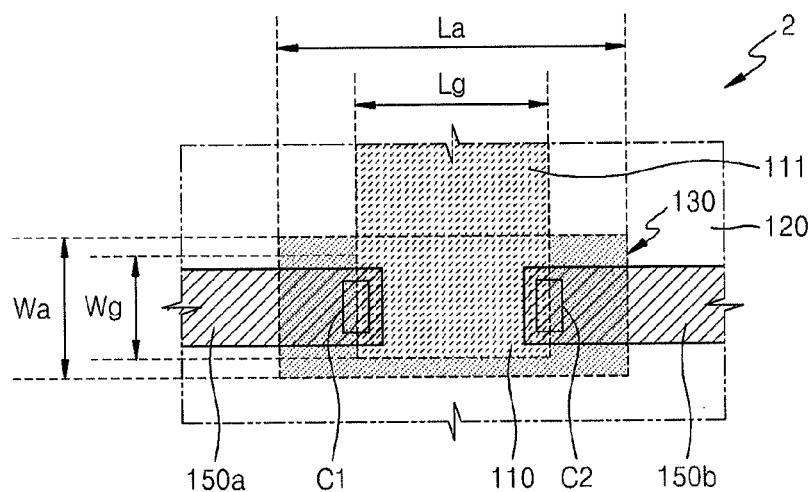
FIG. 3 illustrates a plan view of a TFT according to a comparative example.

FIG. 3 illustrates a plan view of a TFT 2 according to a comparative example.

Referring to FIG. 3, the TFT 2 includes a gate electrode 10, an active layer 30, and a source electrode 50a and a drain electrode 50b.

In the comparative example, the active layer 30 has the second length La measured in the first direction X and the second width Wa measured in the second direction Y, like the embodiment disclosed in FIGS. 1A and 1B. However, although the gate electrode 10 according to the comparative example has the first length Lg that is smaller than the second length La of the active layer 30 in the first direction X, the gate layer 10 of the comparative example also has the first width Wg that is greater than the second width Wa of the active layer 30 in the second direction Y.

That is, opposite side edges of the gate electrode 10 extending in the first direction X are spaced apart from opposite side edges of the active layer 30 extending in the first direction X so as to be within the opposite side edges of the active layer 30 extending in the first direction X. However, opposite side edges of the gate electrode 110 extending in the second direction Y overlap with opposite side edges of the active layer 130 extending in the second direction Y so as to be outside the opposite side edges of the active layer 130 extending in the second direction Y. That is, the gate electrode 10 and the active layer 30 overlaps with the boundary of the channel in the first direction X by the first length Lg of the gate electrode 10 in the first direction X.

In the TFT 2 according to the comparative example of FIG. 3, portions of the gate electrode 10 and the active layer 30 that overlap with the boundary of the channel are increased compared to in the TFT 1 illustrated in FIGS. 1A and 1B. Thus, stable device characteristics may not be obtained due to a change in a threshold voltage Vth according to a drain voltage.

Figure 4:
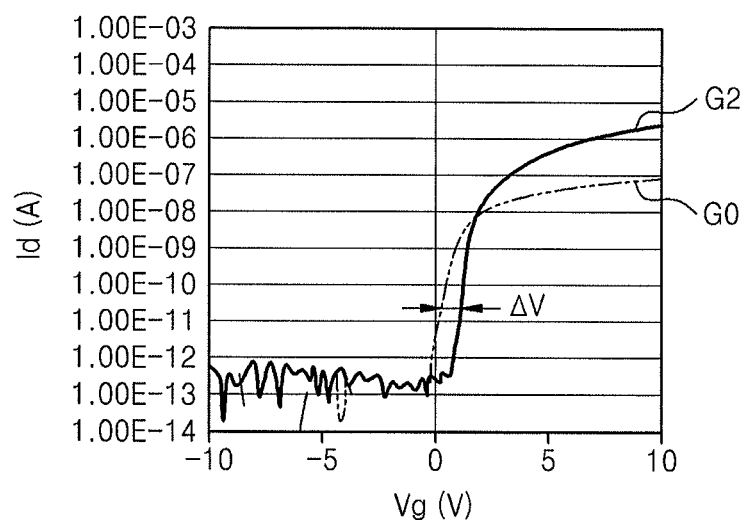
FIG. 4 illustrates a graph of a Vg-Id relationship of the TFT of the comparative example of FIG. 3.

FIG. 4 illustrates a graph of a Vg-Id relationship of the TFT 2 of the comparative example of FIG. 3.

The graph of FIG. 4 relates to a TFT in which the first length Lg of the gate electrode 10 measured in the first direction X, is 50 μm, the first width Wg measured in the second direction Y is 25 μm, and a width of a portion of the wiring 111 that overlaps with the boundary of the channel in the first direction X is equal to the first length Lg (=50 μm) of the gate electrode 10.

In FIG. 4, G0 indicates a Vg-Id relationship of a bias voltage (VD=0.1 V), and G2 indicates a Vg-Id relationship when a drain voltage (VD) is 5.1 V.

Referring to G0 and G2, with regard to the TFT 2 according to the comparative example, as a drain voltage increases, G2 is shifted right by ΔV. Thus, in the TFT 2 according to the comparative example, since a portion that overlaps with the channel is increased, stable device characteristics may not be obtained due to a change in a threshold voltage Vth of the TFT 2 according to a drain voltage.

FIGS. 5 through 8 illustrate cross-sectional views of TFTs 3, 4, 5, and 6 according to other embodiments.

Figure 5:
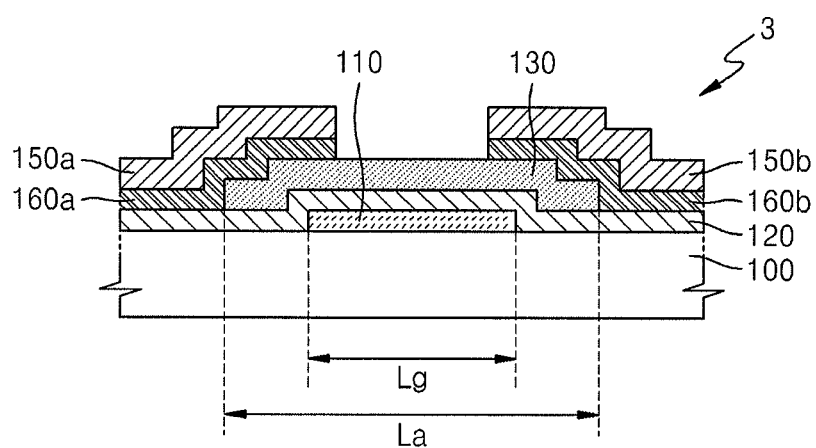
FIG. 5 illustrates a cross-sectional view of a TFT according to another embodiment.

FIG. 5 illustrates a cross-sectional view of the TFT 3 according to another embodiment.

Referring to FIG. 5, the TFT 3 has a bottom gate structure in which the gate electrode 110, the active layer 130, and the source electrode 150a are the drain electrode 150b are sequentially formed on the substrate 100, like the TFT 1 illustrated in FIGS. 1A and 1B. However, unlike the TFT 1 illustrated in FIGS. 1A and 1B, the source electrode 150a and the drain electrode 150b are not connected to the active layer 130 through the contact holes C1 and C2 (see FIG. 1A) and ohmic contact layers 160a and 160b are respectively disposed between the active layer 130 and the source/drain electrodes 150a and 150b.

Figure 6:
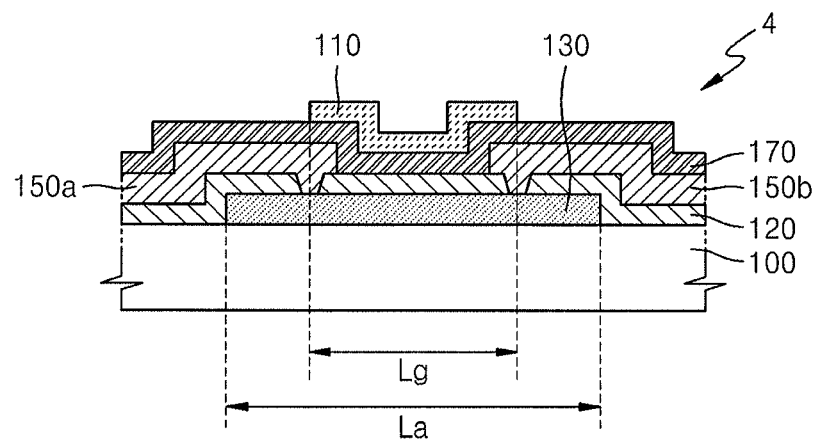
FIG. 6 illustrates a cross-sectional view of a TFT according to another embodiment.

FIG. 6 illustrates a cross-sectional view of the TFT 4 according to another embodiment.

Referring to FIG. 6, the TFT 4 has a top gate structure in which the active layer 130, the source electrode 150a and the drain electrode 150b, and the gate electrode 110 are sequentially formed on the substrate 100. The source electrode 150a and the drain electrode 150b are connected to the active layer 130 through the contact holes C1 and C2 formed in the first insulating layer 120.

Figure 7:
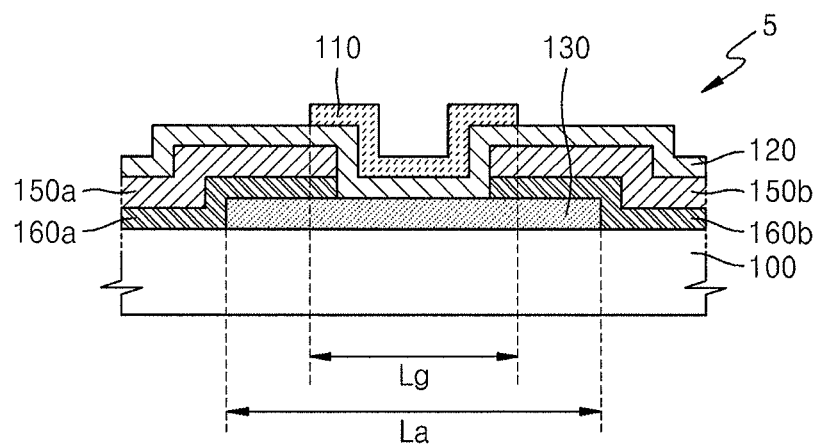
FIG. 7 illustrates a cross-sectional view of a TFT according to another embodiment.

FIG. 7 illustrates a cross-sectional view of the TFT 5 according to another embodiment.

Referring to FIG. 7, the TFT 5 has a top gate structure in which in which the active layer 130, the source electrode 150a and the drain electrode 150b, and the gate electrode 110 are sequentially formed on the substrate 100, like the TFT 4 of FIG. 6. However, unlike in the TFT 4 of FIG. 6, the source electrode 150a and the drain electrode 150b are not connected to the active layer 130 through the contact holes C1 and C2 (see FIG. 6) and the ohmic contact layers 160a and 160b are respectively disposed between the active layer 130 and the source/drain electrodes 150a and 150b.

Figure 8:
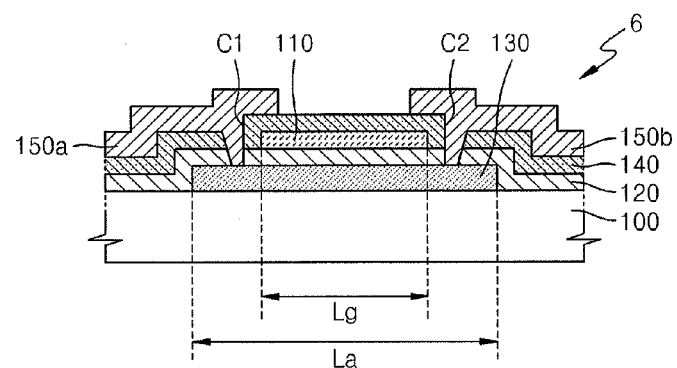
FIG. 8 illustrates a cross-sectional view of a TFT according to another embodiment.

FIG. 8 illustrates a cross-sectional view of the TFT 6 according to another embodiment.

Referring to FIG. 8, the TFT 6 has a top gate structure in which the active layer 130, the gate electrode 110, and the source electrode 150a and the drain electrode 150b are sequentially formed on the substrate 100. An order of the gate electrode 110 and the active layer 130 is different from that of the TFT 1 illustrated in FIGS. 1A and 1B.

FIGS. 5 through 8 illustrate only sectional views showing that the first length Lg of the gate electrode 110 is smaller than the second length La of the active layer 130, in the TFTs 3, 4, 5, and 6. However, in addition, like in the TFT 1 illustrated in FIGS. 1A and 1B, the first width Wg of the gate electrode 110 in these embodiments is smaller than the second width Wa of the active layer 130. Thus, a portion of the gate electrode 110 that overlaps with the boundary of the channel is small. Thus, a threshold voltage (Vth) of a TFT may be barely changed according to a drain voltage, and a TFT having stable device characteristics may be obtained.

The TFTs 3, 4, 5, and 6 of FIGS. 5 through 8 are non-limiting examples. In other implementations, TFTs having various structures may be provided.

Figure 9:
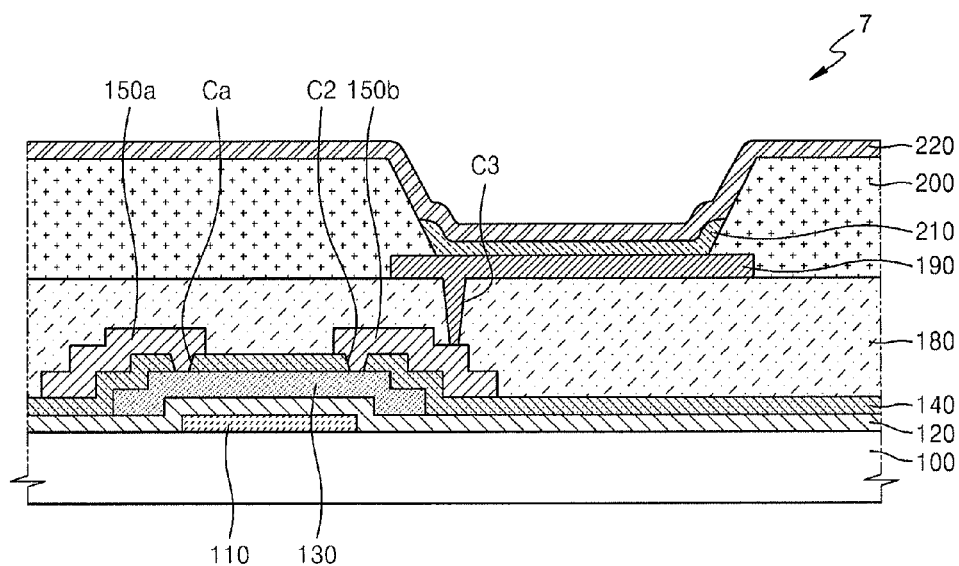
FIG. 9 illustrates a cross-sectional view of an organic light-emitting display apparatus 7 including the TFT of FIGS. 1A and 1B, according to an embodiment.

FIG. 9 illustrates a cross-sectional view of an organic light-emitting display apparatus 7 including the TFT 1 illustrated in FIGS. 1A and 1B, according to an embodiment.

The organic light-emitting display apparatus 7 of FIG. 9 includes a TFT including an oxide semiconductor. FIG. 9 shows the TFT 1 illustrated in FIGS. 1A and 1B, but in other implementations, the organic light-emitting display apparatus 7 may include the TFTs 3 through 6 of FIGS. 5 through 8.

In the organic light-emitting display apparatus 7, the gate electrode 110, the first insulating layer 120, the active layer 130, the second insulating layer 140, and the source electrode 150a and the drain electrode 150b may be sequentially formed on the substrate 100, and a third insulating layer 180 may be formed on the source electrode 150a and the drain electrode 150b. Components of the TFT may be the same as in FIGS. 1A and 1B, and thus, the details thereof will not be repeated.

The TFT may be connected to, and may drive, a display device such as an organic light emitting diode (OLED). For example, a pixel electrode 190 may be connected to the drain electrode 150b through a contact hole C3 formed in the third insulating layer 180. FIG. 9 shows a case in which the TFT is a driving transistor in which one of the source electrode 150a and the drain electrode 150b is connected directly to the pixel electrode 190. However, as described above, a TFT according to the embodiments may be a switching TFT.

An organic light emitting layer 210 may be formed on the pixel electrode 190. An opposite electrode 220 as a common electrode may be formed on the organic light emitting layer 210. In the organic light-emitting display apparatus 7, the pixel electrode 190 may be used as an anode, and the opposite electrode 220 may be used as a cathode. The polarities of the pixel electrode 190 and the opposite electrode 220 may be opposite to each other.

The organic light emitting layer 210 may include an organic emission layer (organic EML) that includes a small molecule organic material or a polymer organic material. When the organic EML includes the small molecule organic material, a hole transport layer (HTL), a hole injection layer (HIL), an electron transport layer (ETL), and an electron injection layer (EIL) may be stacked with respect to the organic EML. In other implementations, various layers may be stacked as desired. An organic material may include copper phthalocyanine (CuPc), N'-di(naphthalene-1-yl)-N,N'-diphenyl-benzidine (NPB), tris-8-hydroxyquinoline aluminum (Alq3), or the like. When the organic EML includes the polymer organic material, a HTL may be included, in addition to the organic EML 120. The HTL may be formed of poly-(3,4)-ethylene-dihydroxy thiophene (PEDOT) or polyaniline (PANI). Here, an organic material may include a polymer organic material such as a phenylenevinylene (PPV)-based polymer organic material and a polyfluorene-based polymer organic material.

When the pixel electrode 190 is used as a transparent electrode, the opposite electrode 220 may be used as a reflective electrode. In other implementations, the pixel electrode 190 may be used as a reflective electrode and the opposite electrode 220 may be used as a transparent electrode. Likewise, light emitted from the organic light emitting layer 210 may be discharged out of the organic light-emitting display apparatus 7 through the transparent electrode so as to display an image.

Although not shown in FIG. 9, an encapsulation member (not shown) for protecting the organic light emitting layer 210 from external oxygen and moistures may be disposed on the opposite electrode 220.

A TFT including an oxide semiconductor may have excellent device characteristics and may be processed at a low temperature. Thus, a TFT may be ideal as a backplane of a flat display. In addition, the TFT including an oxide semiconductor may be transparent in a visible ray band and also may be flexible. Thus, the TFT may be used in a transparent display apparatus or a flexible display apparatus. As described above, the TFT including an oxide semiconductor may have stable device characteristics since a threshold voltage (Vth) of a TFT according to a drain voltage is barely changed. Thus, the TFT may be used as a switching transistor and/or a driving transistor in a backplane of a flat display.

The organic light-emitting display apparatus may be transparent and flexible. Thus, the organic light-emitting display apparatus may be largely used together with the TFT including an oxide semiconductor in a transparent display apparatus or a flexible display apparatus.

Although embodiments have been described with regard to an organic light-emitting display apparatus, it is to be understood that in other implementations, other display apparatuses, such as a liquid crystal display apparatus including liquid crystals may be used.

By way of summation and review, embodiments provide a TFT having excellent device characteristics. According to one or more embodiments, in a TFT, a portion of a gate electrode that overlaps with a boundary of an active layer is reduced, and thus a threshold voltage is barely changed, thereby obtaining stable device characteristics. A display apparatus such as an organic light-emitting display apparatus may include the TFT, Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A thin film transistor, comprising:
   a gate electrode having a first length measured in a first direction and a first width measured in a second direction;
   an active layer having a second length measured in the first direction, and a second width measured in the second direction, the second length of the active layer being greater than the first length of the gate electrode, and the second width of the active layer being greater than the first width of the gate electrode; and
   a source electrode and a drain electrode that are connected to the active layer,
   wherein at least one of opposite side edges of the gate electrode extending in the first direction is spaced apart from a corresponding opposite side edge of the active layer extending in the first direction.

2. The thin film transistor as claimed in claim 1, wherein the opposite side edges of the gate electrode extending in the first direction are spaced apart from the opposite side edges of the active layer extending in the first direction.

3. The thin film transistor as claimed in claim 2, wherein the opposite side edges of the gate electrode extending in the first direction are spaced apart by a same interval from the opposite side edges of the active layer extending in the first direction.

4. The thin film transistor as claimed in claim 2, wherein the opposite side edges of the gate electrode extending in the first direction are disposed within the opposite side edges of the active layer extending in first direction.

5. The thin film transistor as claimed in claim 1, wherein:
   one of the opposite side edges of the gate electrode extending in the first direction is connected in the second direction to a wiring having a width in the first direction that is smaller than the first length of the gate electrode, and
   the wiring overlaps with a boundary of the active layer extending in the first direction.

6. The thin film transistor as claimed in claim 1, wherein the first length of the gate electrode is greater than the first width of the gate electrode.

7. The thin film transistor as claimed in claim 1, wherein the source electrode and the drain electrode extend in the first direction and face each other.

8. The thin film transistor as claimed in claim 1, wherein the active layer includes an oxide semiconductor.

9. The thin film transistor as claimed in claim 8, wherein the active layer includes oxygen and at least one selected from gallium, indium, zinc, hafnium, and tin.

10. The thin film transistor as claimed in claim 1, wherein the source electrode and the drain electrode are connected to the active layer through respective contact holes.

11. The thin film transistor as claimed in claim 10, wherein:
    the active layer includes a region in which ion impurities are doped, and
    the source electrode and the drain electrode are connected to the region through the contact holes.

12. The thin film transistor as claimed in claim 1, wherein the source electrode and the drain electrode are connected to the active layer through respective ohmic contact layers.

13. The thin film transistor as claimed in claim 1, wherein the gate electrode is disposed below the active layer.

14. The thin film transistor as claimed in claim 1, wherein the gate electrode is disposed above the active layer.

15. A display apparatus, comprising:
    a thin film transistor including:
        a gate electrode having a first length measured in a first direction and a first width measured in a second direction,
        an active layer having a second length measured in the first direction and a second width measured in the second direction, the second length of the active layer being greater than the first length of the gate electrode, and the second width of the active layer being greater than the first width, and
        a source electrode and a drain electrode that are connected to the active layer, wherein at least one of opposite side edges of the gate electrode extending in the first direction is spaced apart from opposite side edges of the active layer extending in the first direction; and
    a display device driven by the thin film transistor.

16. An organic light-emitting display apparatus, comprising:
    a thin film transistor including:
        a gate electrode having a first length measured in a first direction and a first width measured in a second direction,
        an active layer having a second length measured in the first direction and a second width measured in the second direction, the second length of the active layer being greater than the first length of the gate electrode, and the second width of the active layer being greater than the first width, and
        a source electrode and a drain electrode that are connected to the active layer, wherein at least one of opposite side edges of the gate electrode extending in the first direction is spaced apart from opposite side edges of the active layer extending in the first direction;
    a pixel electrode connected to one of the source electrode and the drain electrode of the thin film transistor;
    an opposite electrode facing the pixel electrode; and
    an organic light-emitting layer disposed between the pixel electrode and the opposite electrode.

* * * * *